US006609234B2

(12) United States Patent
Kurupati

(10) Patent No.: US 6,609,234 B2
(45) Date of Patent: Aug. 19, 2003

(54) ORDERING BINARY DECISION DIAGRAMS USED IN THE FORMAL EQUIVALENCE VERIFICATION OF DIGITAL DESIGNS

(75) Inventor: Sreenath Kurupati, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/895,919

(22) Filed: Jun. 29, 2001

(65) Prior Publication Data

US 2003/0023942 A1 Jan. 30, 2003

(51) Int. Cl.$^7$ ............................................... G06F 17/50
(52) U.S. Cl. ................................................ 716/7; 716/2
(58) Field of Search .......................................... 716/7, 2

(56) References Cited

U.S. PATENT DOCUMENTS

| | | | | |
|---|---|---|---|---|
| 5,331,568 A | * | 7/1994 | Pixley | 716/3 |
| 5,748,486 A | * | 5/1998 | Ashar et al. | 716/18 |
| 5,937,183 A | * | 8/1999 | Ashar et al. | 703/14 |
| 6,212,669 B1 | * | 4/2001 | Jain | 716/7 |
| 6,301,687 B1 | * | 10/2001 | Jain et al. | 716/3 |
| 6,360,352 B2 | * | 3/2002 | Wallace | 716/12 |
| 6,389,374 B1 | * | 5/2002 | Jain et al. | 703/2 |

OTHER PUBLICATIONS

S. Woods et al., Efficient Solution of Systems of Boolean Equations, International Conference on Computer–Aided Design, 1996, pp. 542–546.*

Shih–Chieh Chang et al., Minimizing ROBDD Size of Incompletely Specified Multiple Output Finctions, Proceedings of European Design and Test Conference, 1994, pp. 620–624.*

V. Bertacco et al., Boolean Function Representation Based on Disjoint–Support Decompositions, IEEE Conference on Computer Design: VLSI in Computers and Processors 1996, pp. 27–32.*

C. Legl et al., Computing Support–Minimal Subfunctions During Functional Decomposition, IEEE Transactions on Very Large Scale Integration Systems, Sep. 1988, pp. 354–363.*

J. Jain et al., IBDDs: An Efficient Functional Representation for Digital Circuits, Proceedings of the Third European Conference on Design Automation, 1992, pp. 440–446.*

* cited by examiner

Primary Examiner—Matthew Smith
Assistant Examiner—A. M. Thompson
(74) Attorney, Agent, or Firm—Kenyon & Kenyon

(57) ABSTRACT

A method for ordering input variables in binary decision diagrams is described. Once a plurality of disjoint sets of input variables can be found from the sub-equations of a Boolean function, an initial top-level order can be used to form a significantly smaller diagram. The diagram can by reduced further by application of the method recursively on the sub-equations and successive sub-equations until primary inputs are reached.

24 Claims, 5 Drawing Sheets

$F = ab + cd + ae + bfg$ $F_x = ab + ae + bfg$; set $X = \{a,b,e,f,g\}$ $F_y = cd$; set $Y = \{c,d\}$ $F = ab + cd + ax + lmn + xy + yc + no$

|  D[7][7] = | ab | cd | ax | lmn | xy | yc | no |
|---|---|---|---|---|---|---|---|
| ab  | 2 | 0 | 1 | 0 | 0 | 0 | 0 |
| cd  | 0 | 2 | 0 | 0 | 0 | 1 | 0 |
| ax  | 1 | 0 | 2 | 0 | 1 | 0 | 0 |
| lmn | 0 | 0 | 0 | 3 | 0 | 0 | 1 |
| xy  | 0 | 0 | 1 | 0 | 2 | 1 | 0 |
| yc  | 0 | 1 | 0 | 0 | 1 | 2 | 0 |
| no  | 0 | 0 | 0 | 1 | 0 | 0 | 2 |

$F_x = ab + ax + xy + yc + cd$; set X = {a,b,c,d,x,y}

$F_y = lmn + no$; set Y = {l,m,n,o}

ORDERING BINARY DECISION DIAGRAMS USED IN THE FORMAL EQUIVALENCE VERIFICATION OF DIGITAL DESIGNS

BACKGROUND OF THE INVENTION

The present invention pertains to a method for ordering reduced ordered binary decision diagrams (ROBDDS) in the formal equivalence verification of digital designs. More particularly, the present invention pertains to producing an efficient ordering for ROBDDs to reduce the run time of equivalence verification in digital designs.

As is known in the art, a Boolean function is a mapping that gives a Boolean value for a given combination of input values. Many problems in the computer-aided design (CAD) for digital circuits can be represented as a set of operations performed over a set of Boolean functions. Hence, efficient representation and manipulation of Boolean functions is an important component of digital designs. For example, when comparing and verifying equivalence between the register transfer language (RTL) and the detailed logic drawing of a schematic, both models can be compiled into an intermediate form representing Boolean equations for the outputs of both the models. The Boolean equations are then compared for each output during equivalence verification of the models.

Various representations of Boolean functions are possible, including Boolean equations, truth tables, and binary decision diagrams (BDDs). A BDD is a directed acyclic graph (DAG). The branching graph represents a combination of input values leading to an output value, with each node representing an input variable and each edge representing the value of the given variable. Each path from the source input to each sink output represents an assignment of values of all inputs. An ordered binary decision diagram (OBDD) is a BDD with the constraint that the input variables are ordered and every source to sink path in the OBDD visits the input variable in the same order.

Nodes in an OBBD can be eliminated via node sharing and by removing redundant nodes. The resulting graph is called a reduced order binary decision diagram (ROBDD). A ROBDD is an OBDD where each node represents a distinct logic function.

Furthermore, for a given Boolean function and for a fixed ordering, there exists a single unique ROBDD. While many different Boolean equations may represent a single Boolean function, the fixed ordered ROBDD for a given Boolean function is unique. Hence, equivalence of corresponding ROBDDs (i.e. ROBDDs that match node for node) implies functional equivalence. As such, ROBDDs are utilized in formal equivalence verification for possessing inherent properties for representing Boolean functions both compactly and uniquely.

Ordering of the input variables is crucial in determining the size of the ROBDD (i.e. the number of nodes). Depending on the order of inputs for an equation with N inputs, the number of nodes can be exponential in N or very small. Thus, an efficient ordering can lead to significant reduction of nodes, and thereby, a reduced run-time in equivalence verification.

As is known in the art, formal equivalence verification involves proving the equivalence of two designs. To prove that both designs are equivalent, each processor design to be simulated is compiled into an intermediate format which can be used to build ROBDDs for comparison. Current tools which produce the ordering of input variables do so based on generic Boolean equations without utilizing some of the characteristics present in Boolean equations which describe digital designs. Formal equivalence verification tools using these methods may not run within a reasonable amount of time or fail to complete due to inefficient or incomplete ordering of variables.

In view of the above, there is a need for an improved method for ordering ROBDDs used in the equivalence verification of processors.

BRIEF DESCRIPTION OF THE DRAWINGS

FIG. 5 is an example of finding sub-equations with disjoint sets of input variables performing a DFS traversal of a dependency matrix.

DETAILED DESCRIPTION OF THE DRAWINGS

Figure 1:
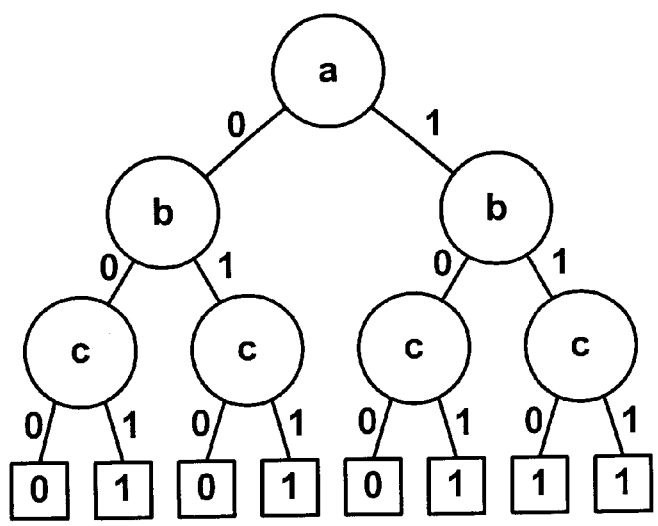
FIG. 1 is an example of a binary decision diagram.

FIG. 1 is an example of a BDD. FIG. 1 is the BDD representation of the Boolean function F=a·b+c. The diagram shows the fundamental elements of the BDD, featuring the nodes, representing input variables a, b and c, and the branches, when a, b and c are 0/1 respectively.

Figure 2:
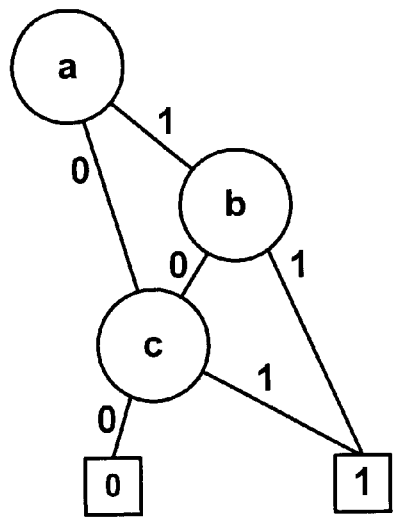
FIG. 2 is an example of a reduced ordered binary decision diagram.

FIG. 2 is an example of a reduced ordered binary decision diagram. FIG. 2 shows the ROBDD produced according to the Boolean function F=a·b+c, with a sequence order of a, then b, and then c. Using this sequence order for the input variables, the resulting diagram contains three nodes. Hence, based on this ordering, the ROBDD reduces the original BDD from 8 nodes to 3 nodes.

Figure 3:
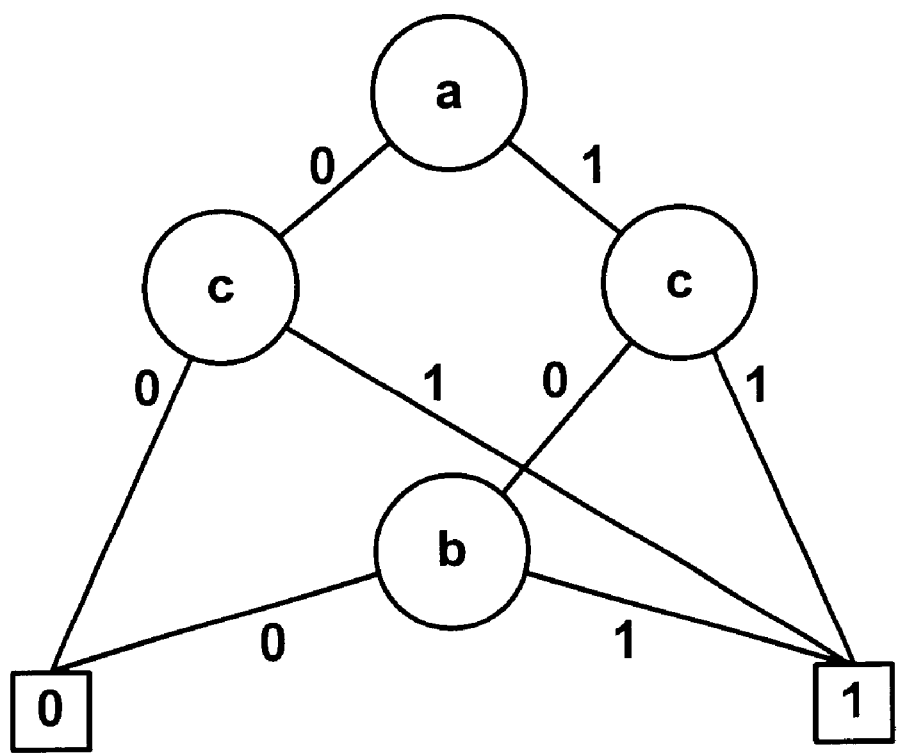
FIG. 3 is an example of a reduced ordered binary decision diagram with input variables reordered from FIG. 2.

FIG. 3 is an example of a reduced ordered binary decision diagram with input variables in a different order, in contrast to the sequence order from FIG. 2. FIG. 3 shows a ROBDD according to the Boolean function F=a·b+c, with a sequence order of a, then c, and then b. This sequence order for input variables results in a diagram containing four nodes. Based on this ordering, the ROBDD reduces the original BDD from 8 nodes to 4 nodes. This ordering, while reducing the number of nodes of the BDD, is inefficient compared to the previous ordering of inputs used in FIG. 2. Using different ordering produces different sizes of ROBDDs. Hence, given an efficient ordering of input variables, the size of the ROBDD can be reduced significantly.

Figure 4:
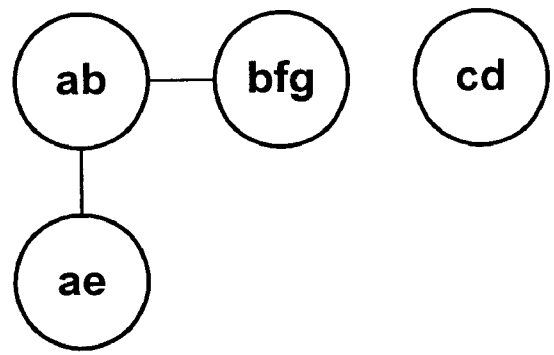
FIG. 4 is an example of finding sub-equations with disjoint sets of input variables (a disconnected sub-graph) by performing a depth-first search (DFS) traversal of a connectivity graph.

FIG. 4 is an example of finding sub-equations with disjoint sets of input variables (here, a disconnected sub-graph) by performing a depth-first search (DFS) traversal of a connectivity graph. Each node within the connectivity graph represents a sub-term and each edge represents the presence of common inputs. FIG. 4 shows one method of finding the initial top-level order for the resulting ROBDD. A connectivity graph is created for Boolean function F=ab+cd+ae+bfg. The connectivity graph is then analyzed to see if there exists as least two disconnected sub-graphs. Here in FIG. 4, performing a DFS traversal of the connectivity graph reveals two disconnected sub-graphs. Each of the sub-graphs becomes a sub-equation in the initial top-level ordering of the input variables. The original Boolean equation is broken up into two sub-equations, $F_x$=ab+ae+bfg, with set X={a,b,e,f,g} and $F_y$=cd, with set Y={c,d}. The braces around each set indicate that the input variables within each set should be kept grouped together, and also, that the input variables may be ordered in any combination within each grouping. Hence, a resulting initial top-level ordering of the input variables can be {{a,b,e,f,g}, {c,d}}. The input variables within each set can also be ordered to further reduce the size of the ROBDD. $F_x$ and $F_y$ can also be explored for additional sub-equations with disjoint sets of input variables. This can be done recursively on each and every sub-equation until primary inputs are reached, thereby completing the ordering of input variables for the ROBDD.

FIG. 5 is an example of finding sub-equations with disjoint sets of input variables by performing a DFS traversal of a dependency matrix. The dependency matrix reveals the number of common inputs between various sub-terms, such that the element {i,j} within the matrix is equal to the number of common inputs in sub-terms i and j. Here in FIG. 5, one method of finding the initial top-level order for the resulting ROBDD is shown. A dependency matrix is created for Boolean function F=ab+cd+ax+lmn+xy+yc+no. A DFS search of the dependency matrix reveals two disjoint sets. Each of the sets becomes a sub-equation in the initial top-level ordering of the input variables. The original Boolean equation is broken up into two sub-equations, $F_x$=ab+ax+xy+yc+cd, with set X={a,b,c,d,x,y} and $F_y$=lmn+no with set Y={l,m,n,o}. The braces around each set indicate that the input variables within each set should be kept grouped together, and also, that the input variables may be ordered in any combination within each grouping. Hence, a resulting initial top-level ordering of the input variables can be {{a,b,c,d,x,y}, {l,m,n,o}}. Utilizing this method recursively on each of the sub-equations, the ordering of input variables can be optimized within each subset until the primary inputs are reached.

Figure 6:
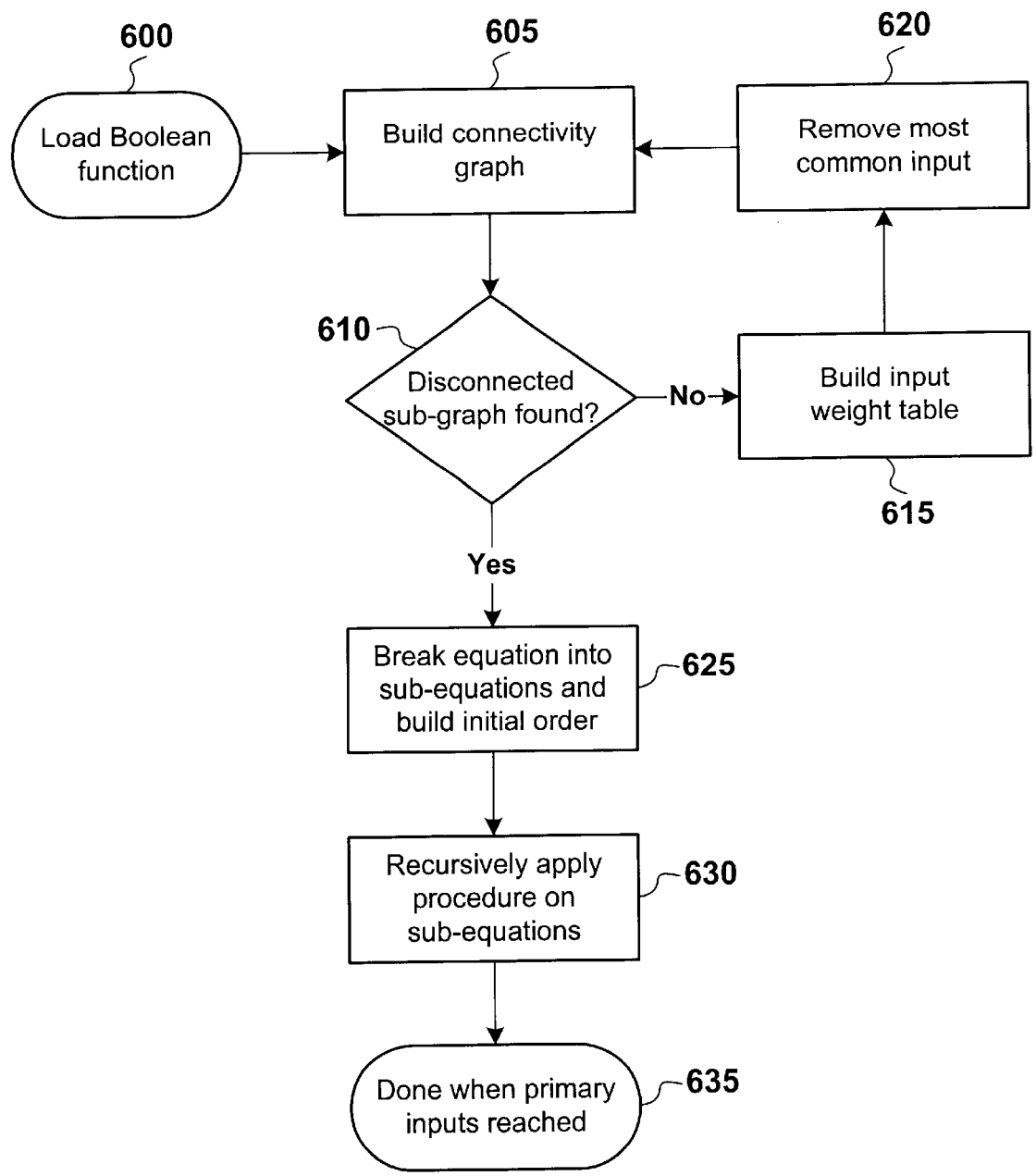
FIG. 6 is a flow diagram showing an embodiment of a method according to an embodiment of the present invention.

FIG. 6 is a flow diagram showing an embodiment of a method according to an embodiment of the present invention. In block 600, the Boolean function is loaded and parsed for processing, which begins in block 605, where a connectivity graph is built from the equation. Control then passes to decision block 610. In decision block 610, it is determined whether a disconnected sub-graph can be found. If there are none, control passes to block 615, where an input weight table is created for the equation. Control then passes to block 620, where the most common input is removed. With a common input removed, control returns to block 605, where a connectivity graph is rebuilt in block 605 in search of a disconnected sub-graph in block 610. If a disconnected sub-graph is found at any point (decision block 610), control proceeds to block 625 where the equation is broken into sub-equations and an initial top-level order is built. Control then passes to block 630 where this method is applied recursively on the sub-equations to continue to optimize the ordering of inputs. When the primary inputs are reached, in block 635, an ordering for the inputs is obtained.

A mathematical claim according to an embodiment of the present invention is presented in Table 1. From a purely mathematically perspective, the mathematical claim of Table 1 demonstrates a significant reduction in the number of maximum nodes of a ROBDD, MaxB, when an ordering for inputs of the given Boolean function is determined.

TABLE 1

A Mathematical Claim for the Reduction of the Maximum Nodes of a ROBDD Representing a Boolean Function with Sub-equations Having Disjoint Sets Given Boolean function F = $F_x$ Op $F_y$, (Op is either the AND or OR operator)
$F_x$ has n inputs, with set X = {$x_1$, $x_2$, $x_3$ . . . $x_n$},
$F_y$ has m inputs with set Y = {$y_1$, $y_2$, $y_3$ . . . $y_m$}.
Theoretically, the upper bound (maximum nodes) for the ROBDD = $2^{(m+n)}$ = MaxB.
If X and Y represent disjoint sets, an order can be constructed yielding:
MaxB = $2^m + 2^n$
The ordering to achieve MaxB = $2^m + 2^n$ is {{Y}, {X}} or {{X}, {Y}} where {X} represents any combination of groupings within the variables of {X}.

The mathematical claim of Table 1 allows for inputs within Boolean function F to also be equations themselves (e.g. Boolean function F may contain input $x_1$=z+1). While the mathematical claim provided demonstrates that substantial benefits can be produced to reduce the size of ROBDDs and improve the runtime of equivalence verification simulations, it does not guarantee improvement in all theoretical worst-case scenarios.

Utilizing the mathematical claim in Table 1, Example 1 demonstrates the size reduction of a ROBDD when an efficient ordering of input variables is used.

EXAMPLE 1

$F$=xy+cd+ae+bfg+yz+yp+(not $l$)mn(not $o$)+pq+ab

F contains 16 inputs.
Therefore, MaxB=$2^{16}$=65,536
F is partitioned as follows:

$F_x$=ab+cd+ae+bfg, $F_y$=xy+yz+yp (not $l$)mn(not $o$)+pq

X={a,b,c,d,e,f,g}, Y={l,m,n,o,p,q,x,y,z}, m=9, n=7

As disjoint sets, an order can be constructed to achieve new MaxB:

MaxB=$2^m+2^n$=$2^9+2^7$=640

One such ordering could be: p,q,l,m,x,y,z,n,o,f,c,a,b,d,e,f,g
Recursively applying this procedure, the ordering within the sets may be optimized:

X={a,b,e,f,g}, {c,d}, Y={x,y,z,p,q}, {l,m,n,o}

One such ordering could then be: x,y,z,p,q,l,m,n,o,c,d,a,b,e,f,g
Therefore, new MaxB=$(2^5+2^4)$=$(2^5+2^2)$=84.
Recursively applying this procedure, the ordering within the sets may be further optimized.

Example 1 demonstrates that utilizing the method, the ROBDD for the given Boolean function realizes an initial reduction in size from 65,536 nodes to 640 node, a factor of 102. By applying the procedure recursively, the ROBDD for the given Boolean function is reduced from the original 65,536 nodes to 84 nodes, a factor of 780. Furthermore, with continued application of the procedure recursively until 5 primary inputs are reached, the size of the ROBDD can be reduced even further. Hence, reducing the size of ROBDDs by such orders of magnitudes significantly reduces and improves the runtime of equivalence verification simulations.

Example 2 demonstrates how common inputs are removed to find a disjoint set for an initial top-level ordering for Boolean function F=ab+bc+cde+ce.

EXAMPLE 2

F=ab+bc+cde+ce

At first, a DFS traversal of the connectivity graph reveals no disconnected sub-graphs.

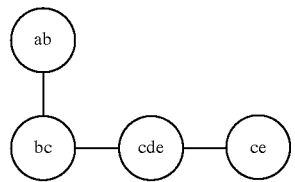

An input weight table is created based on the Boolean function.

| Input | Freq. |
|-------|-------|
| a | 1 |
| b | 2 |
| c | 3 |
| d | 1 |
| e | 2 |

The most common input in the Boolean function, c (with a frequency of 3), is removed and the connectivity graph is re-built with input c removed.

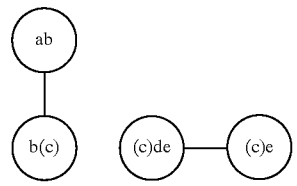

When the connectivity graph is re-built with input c removed, it now reveals two disjoint sets. Hence, input c forms a set and the inputs within each of the remaining sub-graphs form sets in the initial top-level ordering of the input variables. The resulting initial top-level ordering of the input variables can be {c, {a,b}, {d,e}}.

In the event that a disconnected sub-graph is not found after having removed the most common input, each successive most common input is then removed until a disconnected sub-graph is found.

A mathematical claim according to an embodiment of the present invention is present in Table 2. From a purely mathematically perspective, the mathematical claim of Table 2 demonstrates a significant reduction in the number of maximum nodes of a BDD, MaxB, when an ordering is determined for inputs of the given Boolean function with sub-equations $F_x$ and $F_y$, with p variables in common.

TABLE 2

A Mathematical Claim for the Reduction of the Maximum Nodes of a ROBDD Representing a Boolean Function with Sub-equations With p Variables in Common Given Boolean function $F = F_x$ Op $F_y$, (Op is either the AND or OR operator)
$F_x$ has n inputs, with set $X = \{x_1, x_2, x_3 \ldots x_n\}$,
$F_y$ has m inputs with set $Y = \{y_1, y_2, y_3 \ldots y_m\}$.
$F_x$ and $F_y$ have p variables in common (denoted set P).
Theoretically, the upper bound (maximum nodes) for the ROBDD = $2^{(m+n)}$ = MaxB.
Given sets P, X and Y, an order can be constructed yielding:
MaxB = $2^P(2^m + 2^n)$
The ordering to achieve MaxB = $2^P(2^m + 2^n)$ is found in the sets {P, {Y-P}, {X-P}} (in any combination order for dynamic ordering), where {X-P} represents any combination of groupings within the variables of {X-P}.

The mathematical claim of Table 2 allows for inputs within Boolean function F to also be equations themselves (e.g. Boolean function F may contain input $x_1$=z+1). The mathematical claim provided demonstrates that substantial benefits can be produced to reduce the size of ROBDDs and improve the runtime of equivalence verification simulations, but does not guarantee improvement in all theoretical worst-case scenarios. Without p variables in common, the mathematical claim in Table 2 results in the same mathematical claim in Table 1. Hence, if the set denoted P is an empty set such that p=0, the mathematical claim in Table 2, MaxB= $2^P(2^m+2^n)$ becomes MaxB=$2^m+2^n$, the mathematical claim in Table 1.

Utilizing the mathematical claim in Table 2, Example 3 demonstrates the size reduction of a ROBDD when an efficient ordering of input variables is used.

EXAMPLE 3

$$F=(ab+cd+ae+bfg+hi)(xy+yzc+yp+(\text{not } l)mno+pqd)$$

F contains 18 inputs.
Therefore, MaxB=$2^{18}$=262,144
Common inputs set P={c,d} can be removed to find disjoint sets:

$$X=\{a,b,e,f,g,h,i\}, Y=\{x,y,z,l,m,n,o,p,q\}, m=9, n=7$$

As disjoint sets, an order can be constructed to achieve new MaxB:

$$\text{Max}B=2^p(2^m+2^n)=2^2(2^9+2^7)=2560$$

One such ordering could be: a,b,e,f,g,h,i,x,y,z,l,m,n,o,p,q,c,d
Recursively applying this procedure, the ordering within the sets may be further optimized.

Example 3 demonstrates that utilizing the method according to the present invention, the ROBDD for the given Boolean function realizes an initial reduction in size from 262,144 nodes to 2,560 nodes, a factor of 102. By applying the procedure recursively, the ordering within the sets may be optimized to further reduce the size of the ROBDD and further improve the runtime of equivalence verification simulations.

As seen from the above, the efficient ordering of input variables works to provide a reduced ROBDD size by eliminating the total number of nodes that are compared by the formal equivalence verification simulations. The orders of magnitude of reduction are inherently large, allowing formal equivalence verification tools utilizing this method to run to completion within acceptable periods of time.

Although a single embodiment is specifically illustrated and described herein, it will be appreciated that modifications and variations of the present invention are covered by the above teachings and within the purview of the appended claims without departing from the spirit and intended scope of the invention.

What is claimed is:

1. A method of ordering input variables in a binary decision diagram (BDD) representing a Boolean function, comprising:
   performing a search within said Boolean function for first and second sub-equations with first and second disjoint sets of said input variables;
   performing a search for common input variables from said first and second disjoint sets of input variables;
   removing found common input variables from said first and second disjoint sets of input variables; and
   building an order of said input variables based on said disjoint sets and said found common input variables.

2. The method of claim 1 wherein said input variables are grouped within said disjoint sets, orderable in any combination within said sets.

3. The method of claim 1 further comprising:
   building a top-level order of said input variables, wherein building said top-level order comprises:
   selecting and ordering said input variables from said first disjoint set; and
   selecting and ordering said input variables from said second disjoint set.

4. The method of claim 3 wherein said top-level order grouped by said first and second disjoint sets is re-orderable in any combination of said sets and re-orderable in any combination of said input variables within said sets.

5. The method of claim 3 further comprising:
   applying the method of ordering input variables recursively on said first and second sub-equations until primary inputs are reached, wherein said method comprises of:
   performing a search within said first and second sub-equations for additional sub-equations with additional disjoint sets of said input variables; and
   building an order of said input variables based on said disjoint sets.

6. The method of claim 1 wherein said search is performed by a depth-first traversal of a connectivity graph.

7. The method of claim 1 wherein said search is performed by a depth-first traversal of a dependency matrix.

8. The method of claim 1 wherein said ordering is used by a formal equivalence verification system.

9. A method of ordering input variables in a binary decision diagram (BDD) representing a Boolean function, comprising:
   performing a search within said Boolean function for first and second sub-equations with first and second sets of said input variables;
   creating a set of common input variables from said first and second sub-equations;
   removing said common inputs from said first and second sets of input variables to form first and second disjoint sets; and
   building an order of said input variables based on said common input variables set and said first and second disjoint sets.

10. The method of claim 9 wherein said input variables are grouped within said disjoint sets, orderable in any combination within said sets.

11. The method of claim 9 further comprising:
    building a top-level order of said input variables, wherein building said top-level order comprises:
    selecting and ordering said input variables from said common input variables set;
    selecting and ordering said input variables from said first disjoint set; and
    selecting and ordering said input variables from said second disjoint set.

12. The method of claim 11 wherein said top-level order grouped by said first and second disjoint sets, and said common input variables set is re-orderable in any combination of said sets and re-orderable in any combination of said input variables within said sets.

13. The method of claim 11 further comprising:
    applying the method of ordering input variables recursively on said first and second sub-equations until primary inputs are reached, wherein said method comprises of:
    performing a search within said first and second sub-equations for additional sub-equations with additional sets of said input variables;
    creating an additional set of common input variables from said additional sub-equations;
    removing said set of common input variables from said additional sub-equations to form additional disjoint sets; and
    building an order of said input variables based on said additional common input variables set and said additional disjoint sets.

14. The method of claim 9 wherein said ordering is used by a formal equivalence verification system.

15. A set of instructions residing in a storage medium, said set of instructions capable of being executed by a processor to implement a method to order input variables in a binary decision diagram (BDD) representing a Boolean function, the method comprising:

performing a search within said Boolean function for first and second sub-equations with first and second disjoint sets of said input variables;

performing a search for common input variables from said first and second disjoint sets of input variables;

removing found common input variables from said first and second disjoint sets of input variables; and building an order of said input variables based on said disjoint sets and said found common input variables.

16. The set of instructions of claim 15 wherein said input variables are grouped within said disjoint sets, orderable in any combination within said sets.

17. The set of instructions of claim 15 wherein the method further comprises:

building a top-level order of said input variables, wherein building said top-level order comprises:

selecting and ordering said input variables from said first disjoint set; and selecting and ordering said input variables from said second disjoint set.

18. The set of instructions of claim 17 wherein said top-level order grouped by said first and second disjoint sets is re-orderable in any combination of said sets and re-orderable in any combination of said input variables within said sets.

19. The set of instructions of claim 17 wherein the method further comprises:

applying the method of ordering input variables recursively on said first and second sub-equations until primary inputs are reached, wherein said method comprises of:

performing a search within said first and second sub-equations for additional sub-equations with additional disjoint sets of said input variables; and building an order of said input variables based on said disjoint sets.

20. A set of instructions residing in a storage medium, said set of instructions capable of being executed by a processor to implement a method to order input variables in a binary decision diagram (BDD) representing a Boolean function, the method comprising:

performing a search within said Boolean function for first and second sub-equations with first and second sets of said input variables;

creating a set of common input variables from said first and second sub-equations;

removing said common inputs from said first and second sets of input variables to form first and second disjoint sets; and building an order of said input variables based on said common input variables set and said first and second disjoint sets.

21. The set of instructions of claim 20 wherein said input variables are grouped within said disjoint sets, orderable in any combination within said sets.

22. The set of instructions of claim 20 wherein the method further comprises:

building a top-level order of said input variables, wherein building said top-level order comprises:

selecting and ordering said input variables from said common input variables set;

selecting and ordering said input variables from said first disjoint set; and selecting and ordering said input variables from said second disjoint set.

23. The set of instructions of claim 22 wherein said top-level order grouped by said first and second disjoint sets, and said common input variables set is re-orderable in any combination of said sets and re-orderable in any combination of said input variables within said sets.

24. The set of instructions of claim 22 wherein the method further comprises:

applying the method of ordering input variables recursively on said first and second sub-equations until primary inputs are reached, wherein said method comprises of:

performing a search within said first and second sub-equations for additional sub-equations with additional sets of said input variables;

creating an additional set of common input variables from said additional sub-equations;

removing said set of common input variables from said additional sub-equations to form additional disjoint sets; and building an order of said input variables based on said additional common input variables set and said additional disjoint sets.

\* \* \* \* \*